US012660096B2

(12) United States Patent
    Shibata et al.

(10) Patent No.: US 12,660,096 B2
(45) Date of Patent: Jun. 16, 2026

(54) MICROPARTICLE ARRAYING MASK

(71) Applicant: DEXERIALS CORPORATION,
    Tochigi (JP)

(72) Inventors: Akihiro Shibata, Tochigi (JP);
    Masahiro Nishimoto, Tochigi (JP);
    Yusuke Tanaka, Tochigi (JP);
    Hirokazu Odagiri, Tochigi (JP);
    Katsuhiro Doi, Tochigi (JP)

(73) Assignee: DEXERIALS CORPORATION,
    Tochigi (JP)

( * ) Notice: Subject to any disclaimer, the term of this
    patent is extended or adjusted under 35
    U.S.C. 154(b) by 653 days.

(21) Appl. No.: 17/426,446

(22) PCT Filed: Jan. 24, 2020

(86) PCT No.: PCT/JP2020/002542
    § 371 (c)(1),
    (2) Date: Jul. 28, 2021

(87) PCT Pub. No.: WO2020/158608
    PCT Pub. Date: Aug. 6, 2020

(65) Prior Publication Data
    US 2022/0110217 A1     Apr. 7, 2022

(30) Foreign Application Priority Data

Jan. 30, 2019    (JP) ................................. 2019-014278

(51) Int. Cl.
    *H05K 3/3452*        (2026.01)
    *H10W 72/00*         (2026.01)
    *H10W 72/29*         (2026.01)
(52) U.S. Cl.
    CPC ........ *H05K 3/3452* (2013.01); *H10W 72/019*
        (2026.01); *H10W 72/01255* (2026.01); *H10W*
                                      *72/29* (2026.01)

(58) Field of Classification Search
    None
    See application file for complete search history.

(56)            References Cited

U.S. PATENT DOCUMENTS 5,539,153  A  *   7/1996   Schwiebert ............. H01L 24/14
                                                        228/180.1
    6,321,972  B1 *  11/2001   May ..................... H05K 3/3478
                                                        228/41
                    (Continued)

FOREIGN PATENT DOCUMENTS

JP        2000332044  A   *  11/2000
    JP        2004-253770  A      9/2004
                    (Continued)

OTHER PUBLICATIONS

English translation of JP2000332044.*
                    (Continued)

*Primary Examiner* — Charles Capozzi
    (74) *Attorney, Agent, or Firm* — Paratus Law Group,
    PLLC

(57)            ABSTRACT

To prevent defects in microparticles from occurring in a case
of arraying the microparticles having a diameter of less than
or equal to 50 μm on a base material. Provided is a
microparticle arraying mask for arraying microparticles hav-
ing a diameter of less than or equal to 50 μm on a base
material. The microparticle arraying mask has through-holes
into which the microparticles are inserted. An opening plane
of the through-holes on a microparticle supply side has an
area smaller than an area of an opening plane of the
through-holes on a microparticle discharge side. In a case of
assuming that a direction from the opening plane on the
microparticle supply side to the opening plane on the
microparticle discharge side is a positive direction of a
z-axis, and a sectional area of the through-holes vertical to
the z-axis is A, (Continued)

$dA(z)/dz>0$ holds in a whole region in the through-holes along the z-axis, and

Expression (1) below is satisfied:

$$0.4 \leq t/d \leq 1.0 \tag{1}$$

6 Claims, 6 Drawing Sheets

(56) References Cited

U.S. PATENT DOCUMENTS

| | | | | |
|---|---|---|---|---|
| 6,378,762 B1 * | 4/2002 | Takeuchi | ............. | H05K 3/1233 |
| | | | | 228/180.1 |
| 2001/0046586 A1 * | 11/2001 | Chan | ...................... | H05K 3/462 |
| | | | | 264/340 |
| 2010/0078800 A1 * | 4/2010 | Aboush | .............. | H01L 23/3128 |
| | | | | 257/E23.06 |
| 2017/0168402 A1 | 6/2017 | Roos et al. | | |

FOREIGN PATENT DOCUMENTS

| | | | |
|---|---|---|---|
| JP | 2004-327536 | A | 11/2004 |
| JP | 2005-166893 | A | 6/2005 |
| TW | 201614268 | A | 4/2016 |
| TW | 201643544 | A | 12/2016 |
| WO | WO 2013/180035 | A1 | 12/2013 |

OTHER PUBLICATIONS

Mar. 22, 2023, Taiwanese Combined Office Action and Search Report issued for related TW Application No. 109102521.
Sep. 27, 2022, Japanese Office Action issued for related JP Application No. 2019-014278.
Nov. 22, 2022, Korean Office Action issued for related KR Application No. 10-2021-7024044.
Aug. 28, 2024, Chinese Office Action issued for related CN Application No. 202080011787.5.
Jan. 23, 2025, Chinese Office Action issued for related CN Application No. 202080011787.5.
Apr. 14, 2025, Chinese Office Action issued for related CN Application No. 202080011787.5.

* cited by examiner

MICROPARTICLE ARRAYING MASK

CROSS REFERENCE TO PRIOR APPLICATION

This application is a National Stage Patent Application of PCT International Patent Application No. PCT/JP2020/002542 (filed on Jan. 24, 2020) under 35 U.S.C. § 371, which claims priority to Japanese Patent Application No. 2019-014278 (filed on Jan. 30, 2019), which are all hereby incorporated by reference in their entirety.

TECHNICAL FIELD

The present invention relates to a microparticle arraying mask.

BACKGROUND ART

As disclosed in Patent Literature 1, for example, a microparticle arraying mask for arraying microparticles on a base material is known. The microparticle arraying mask has many through-holes formed in a predetermined array pattern. A method of arraying microparticles through use of the microparticle arraying mask is generally as described below. First, the microparticle arraying mask is arranged on a base material, and many microparticles are placed on the microparticle arraying mask. Then, the microparticles on the microparticle arraying mask are scraped with a squeegee or the like. Accordingly, some of the microparticles are inserted into the through-holes, and the remaining microparticles are discharged to the outside of the microparticle arraying mask. Thereafter, by removing the microparticle arraying mask, the microparticles are arrayed on the base material. An array pattern of the microparticles corresponds to an array pattern of the through-holes.

The microparticle arraying mask is used, for example, in a step of manufacturing a particle-filled film or in a step of manufacturing a ball grid array substrate. In the step of manufacturing a particle-filled film, the microparticle arraying mask is used for arraying microparticles on a film on which an adhesive layer has been formed. On the other hand, in the step of manufacturing a ball grid array substrate, the microparticle arraying mask is used for arraying solder balls on a substrate.

In the meantime, from the perspective of accurately arranging microparticles on a base material, it is necessary to minimize falling out, overlapping, and damage of microparticles (which hereinafter may be collectively referred to as "defects in microparticles"). Herein, falling out of microparticles means that microparticles once inserted into through-holes fall out of the through-holes when scraping the microparticles. Overlapping of microparticles means that two or more microparticles are inserted into the same through-hole. Since only a single microparticle is often inserted into a single through-hole, it is required to prevent overlapping. Note that in a case in which two or more microparticles may be inserted into a single through-hole, it is not necessarily required to prevent overlapping. Damage of microparticles means that microparticles inserted into through-holes suffer from damage such as a crack or breakage for some reason.

Therefore, in Patent Literature 1, the through-holes have a tapered shape, and t/d is more than or equal to 0.8 and less than or equal to 1.4. Herein, Patent Literature 1 defines t as the distance from a surface of the base material to a surface of the microparticle arraying mask on the microparticle supply side, and d as the diameter of microparticles.

CITATION LIST

Patent Literature

Patent Literature 1: JP 2004-327536A

SUMMARY OF INVENTION

Technical Problem

In the meantime, Patent Literature 1 is targeted at microparticles having a diameter of less than or equal to 100 μm. However, the inventors of the present application arrayed microparticles having a diameter of less than or equal to 50 μm on a base material using the microparticle arraying mask described in Patent Literature 1 to find out that there are cases in which the above-described defects in microparticles occur.

The present invention was therefore made in view of the above problems, and has an object to provide a novel and improved microparticle arraying mask in which, in a case of arraying microparticles having a diameter of less than or equal to 50 μm on a base material, defects in the microparticles can be prevented from occurring.

Solution to Problem

In order to achieve the above-mentioned object, according to an aspect of the present invention, there is provided a microparticle arraying mask for arraying microparticles having a diameter of less than or equal to 50 μm on a base material. The microparticle arraying mask has through-holes into which the microparticles are inserted. An opening plane of the through-holes on a microparticle supply side has an area smaller than an area of an opening plane of the through-holes on a microparticle discharge side. In a case of assuming that a direction from the opening plane on the microparticle supply side to the opening plane on the microparticle discharge side is a positive direction of a z-axis, and a sectional area of the through-holes vertical to the z-axis is A, $dA(z)/dz > 0$ holds in a whole region in the through-holes along the z-axis, and Expression (1) below is satisfied:

$$0.4 \leq t/d \leq 1.0 \qquad (1)$$

where, in Expression (1), t indicates a thickness of the microparticle arraying mask, and d indicates the diameter of the microparticles.

Herein, the opening plane of the through-holes on the microparticle supply side may have a diameter of less than 100 μm.

In addition, the diameter of the microparticles may be less than or equal to 20 μm.

According to another aspect of the present invention, there is provided a microparticle arraying mask for arraying microparticles on a base material. The microparticle arraying mask has through-holes into which the microparticles are inserted. An opening plane of the through-holes on a microparticle supply side has an area smaller than an area of an opening plane on a microparticle discharge side. In a case of assuming that a direction from the opening plane on the microparticle supply side to the opening plane on the microparticle discharge side is a positive direction of a z-axis, and a sectional area of the through-holes vertical to the z-axis is A, dA(z)/dz>0 holds in a whole region in the through-holes along the z-axis, and the microparticle arraying mask has a thickness of less than or equal to 50 μm.

Advantageous Effects of Invention

According to the present invention as described above, in a case of arraying microparticles having a diameter of less than or equal to 50 μm on a base material, defects in the microparticles can be prevented from occurring.

DESCRIPTION OF EMBODIMENTS

Figure 1:
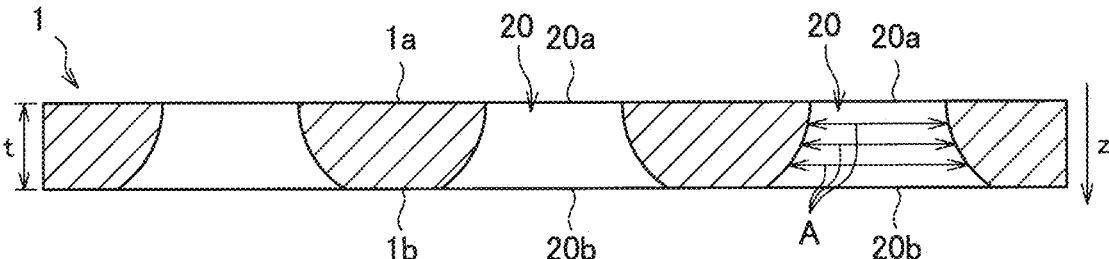
FIG. 1 is a longitudinal sectional view showing a schematic configuration of a microparticle arraying mask according to an embodiment of the present invention.

Hereinafter, referring to the appended drawings, preferred embodiments of the present invention will be described in detail. It should be noted that, in this specification and the drawings, structural elements that have substantially the same function and structure are denoted with the same reference numerals, and repeated explanation thereof is omitted.

<1. Configuration of Microparticle Arraying Mask>

First, on the basis of FIG. 1 to FIG. 4, a configuration of a microparticle arraying mask 1 according to the present embodiment will be described. The microparticle arraying mask 1 is a mask for arraying microparticles 30 having a diameter of less than or equal to 50 μm and more than 0 μm on a base material 100. The diameter of the microparticles 30 is what is called a spherical equivalent diameter. The microparticles 30 basically have a spherical shape, but may have another shape. In a case in which the microparticles 30 vary in diameter, an arithmetic mean value (average particle size) of diameters measured in some of the microparticles 30 may be used as the diameter of the microparticles 30.

Figure 4:
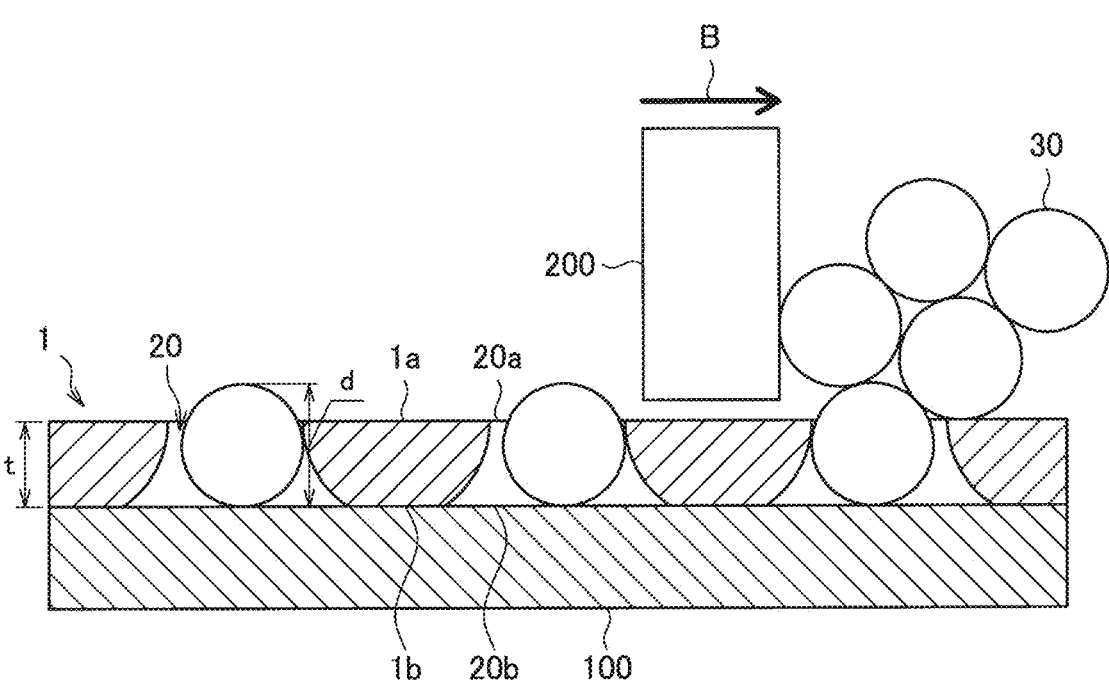
FIG. 4 is a longitudinal sectional view for describing a method of arraying microparticles through use of a microparticle arraying mask.

The microparticle arraying mask 1 has many through-holes 20. The through-holes 20 are holes extending through the microparticle arraying mask 1 in a thickness direction (along a z-axis), and the microparticles 30 shown in FIG. 4 are inserted (thrown) into the through-holes 20. That is, the through-holes 20 are open at both a surface 1a of the microparticle arraying mask on the microparticle supply side and a surface 1b on the microparticle discharge side. Herein, the surface 1a on the microparticle supply side is a surface (an entrance side surface) on which the microparticles 30 are placed when arraying the microparticles 30 on the base material 100 using the microparticle arraying mask 1. The surface 1b on the microparticle discharge side is a surface (an exit side surface) opposed to the base material 100 when arraying the microparticles 30 on the base material 100 using the microparticle arraying mask 1.

The area of an opening plane 20a of the through-hole 20 on the microparticle supply side (the opening area of the through-hole 20 in the entrance side surface 1a) is smaller than the area of the opening plane 20b on the microparticle discharge side (the opening area of the through-hole 20 in the exit side surface 1b). However, the area of the opening plane 20a has such a size that at least the microparticle 30 can be inserted therein. For example, in a case in which the opening plane 20a is circular, and the microparticles 30 are spherical, the diameter of the opening plane 20a is more than or equal to 1.0 times the diameter of the microparticles 30. In a case of inserting a single microparticle 30 into a single through-hole 20, the upper limit value of the diameter of the opening plane 20a is less than 2.0 times the diameter of the microparticle 30. As an example, the diameter of the opening plane 20a may be less than 100 μm. In a case in which a plurality of the microparticles 30 may be inserted into a single through-hole 20, the upper limit value of the diameter of the opening plane 20a may be more than or equal to 2.0 times the diameter of the microparticle 30. In this case, the upper limit value of the diameter of the opening plane 20a may be adjusted in accordance with the number of the microparticles 30 that can be inserted into a single through-hole 20, or the like.

Furthermore, in a case of assuming a direction from the opening plane 20a toward the opening plane 20b as the positive direction along the z-axis, and the sectional area of the through-hole 20 perpendicular to the z-axis, dA(z)/dz>0 holds in the whole region in the through-hole 20 along the z-axis. Herein, z indicates a position in the positive direction along the z-axis. A(z) indicates the sectional area of the through-hole 20 at the position z (sectional area when the through-hole 20 is cut by a cutting plane perpendicular to the z-axis), and "dA(z)/dz" indicates a change rate of the sectional area A(z) along the z-axis. A(0) is equivalent to the area of the opening plane 20a, and A(t) is equivalent to the area of the opening plane 20b. Therefore, the through-hole 20 has what is called a fan-out shape (in other words, a substantially tapered shape flaring from the opening plane 20a to the opening plane 20b). Since the through-hole 20 has the shape enlarged toward the opening plane 20b in this manner, falling out, overlapping, damage, or the like of the microparticles 30 can be prevented when scraping residual microparticles 30 from above the surface 1a of the micropar- ticle arraying mask 1 as shown in FIG. 4.

Figure 2A:
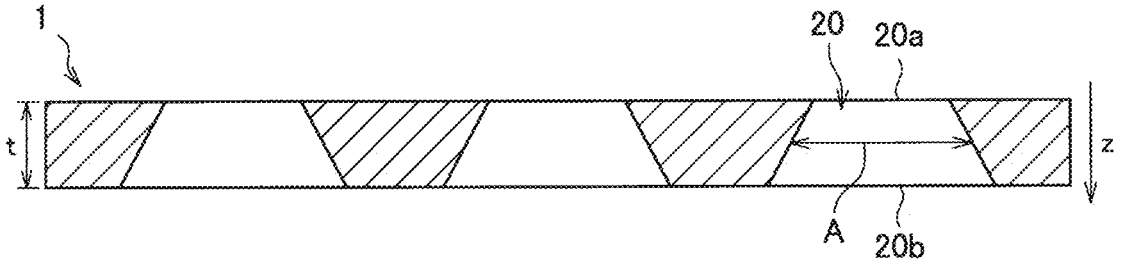
FIG. 2A is a longitudinal sectional view showing a modification of a through-hole shape.
Figure 2B:
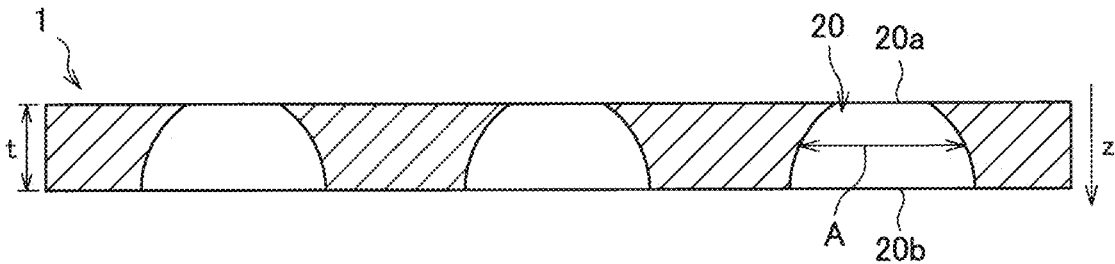
FIG. 2B is a longitudinal sectional view showing a modification of a through-hole shape.
Figure 2C:
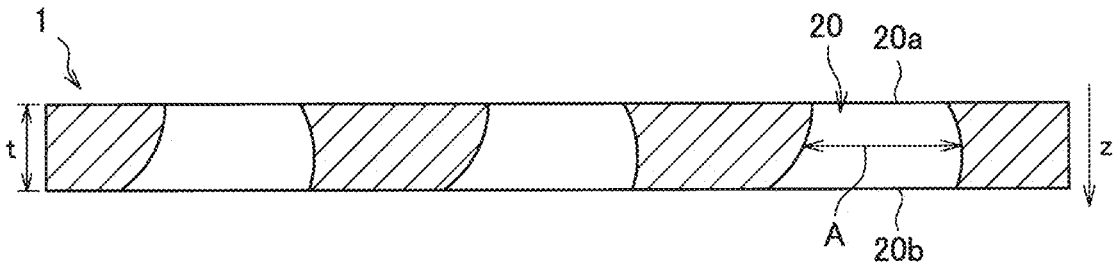
FIG. 2C is a longitudinal sectional view showing a modification of a through-hole shape.

Herein, as long as dA(z)/dz>0 holds, the longitudinal sectional shape of the through-hole 20 (the longitudinal sectional shape of the wall surface of the through-hole 20) is not limited in type. For example, in the example shown in FIG. 1, the longitudinal sectional shape of the through-hole 20 is a curve projecting downward, but may be a linear shape as shown in FIG. 2A, or may be a curve projecting upward as shown in FIG. 2B. Furthermore, the longitudinal sectional shape of the through-hole 20 is a symmetric shape about the central axis of the through-hole 20 (an axis that couples the centers of the sections) in the example shown in FIG. 1, but may be an asymmetric shape about the central axis as shown in FIG. 2C. Alternatively, the longitudinal sectional shape of the through-hole 20 may be a broken line shape (a shape changed in inclination halfway along the z-axis).

Furthermore, as long as $dA(z)/dz>0$ holds, a sectional shape of the through-hole 20 vertical to the z-axis (what is called a transverse sectional shape) is also not particularly limited. The transverse sectional shape is often circular, but may be rectangular or a random shape.

Furthermore, in the present embodiment, Expression (1) below is satisfied.

$$0.4 \leq t/d \leq 1.0 \qquad (1)$$

In Expression (1), t indicates the thickness of the microparticle arraying mask 1, and d indicates the diameter of the microparticles 30. Herein, in a case in which the microparticle arraying mask 1 varies in thickness, an arithmetic mean value of thicknesses measured at some measurement points may be determined as the thickness of the microparticle arraying mask 1.

While the details will be described in examples, by using the microparticle arraying mask 1 that satisfies the requirement of Expression (1) above, the microparticles 30 can be arrayed on the base material 100 while hardly causing defects in the microparticles 30. Herein, the diameter of the microparticles 30 may be less than or equal to 20 μm. Even in this case, the microparticles 30 can be arrayed while hardly causing defects in the microparticles 30. In a case in which t/d is a value falling outside the range of Expression (1) above, many defects in the microparticles 30 may occur. While the details will be described later, by scraping the microparticles 30 on the microparticle arraying mask 1 with a scraping instrument 200, the microparticles 30 are inserted into the through-holes 20. In a case in which t/d is a value falling outside the range of Expression (1) above, for example, less than 0.4, a shear force produced between the microparticles 30 and the wall surfaces of the through-holes 20 when scraping increases, which may damage the microparticles 30.

The upper limit value of t/d preferably is less than or equal to 0.9, and still preferably is less than or equal to 0.8. The lower limit value of t/d preferably is more than or equal to 0.5, and still preferably is more than or equal to 0.6. In this case, defects in the microparticles 30 can be prevented from occurring more reliably.

The thickness t of the microparticle arraying mask 1 preferably is less than or equal to 50 μm. Since the diameter d of the microparticles 30 used in the present embodiment is less than or equal to 50 μm, t/d is naturally less than or equal to 1.0 if the thickness t of the microparticle arraying mask 1 is less than or equal to 50 μm. The lower limit value of the thickness t may be set such that Expression (1) is satisfied, but the lower limit value of the thickness t preferably is more than or equal to 10 μm from perspectives such as manufacturing the microparticle arraying mask 1 stably.

An array pattern of the plurality of through-holes 20 on the surface 1a of the microparticle arraying mask 1 (the xy plane vertical to the z-axis) may be constant or random. For example, the array pattern of the through-holes 20 may be a hexagonal close-packed array, a rectangular array (such as a square lattice array), or the like. In addition, the pitch of the through-holes 20 (a distance between the central axes of the through-holes 20) is not particularly restricted. However, it is preferable that the opening planes 20b on the microparticle discharge side do not interfere with each other because the process of inserting the microparticles 30 is stabilized. From such a perspective, the pitch of the through-holes 20 preferably is larger than the dimeter of the opening plane 20b. A specific array pattern and pitch of the through-holes

20 may be determined as appropriate depending on the application or the like of the base material 100 on which the microparticles 30 are arrayed.

The material of the microparticle arraying mask 1 is not particularly restricted, and may be a material similar to that of a conventional microparticle arraying mask, and may be any type of metallic material, resin material, or the like, for example. However, when considering durability and hole workability, it is preferable to use a metallic material such as SUS or Ni or a resin material such as polyimide as the material of the microparticle arraying mask 1.

Furthermore, the surface of the microparticle arraying mask 1 may be subjected to surface treatment for improving durability, slidability, water repellency, demoldability, and the like. Examples of such surface treatment include silicone-based or fluorine-based coating, glass coating, or the like. Since the opening shape of the through-holes 20 may be affected depending on the film thickness of coating, it is preferable to form the through-holes 20 widely in advance such that a desired shape is obtained after coating.

<2. Method of Manufacturing Microparticle Arraying Mask>

The method of manufacturing the microparticle arraying mask 1 is not particularly restricted, and any method that can manufacture the microparticle arraying mask 1 having the above-described characteristics may be adopted. Examples of the manufacturing method include laser ablation, etching, additive plating, and the like.

In laser ablation, a mask base material is irradiated with laser light focused with a lens to give high energy, thereby selectively dissolving, melting, and evaporating the base material at irradiated positions. The through-holes 20 are thereby formed in the mask base material. In particular, the longitudinal sectional shape and transverse sectional shape of the through-holes 20 to be formed can be controlled by the manner of focusing with an objective lens and an angle irradiated with laser light. A specific method of laser ablation is described in JP 2003-170286A, for example, and this method can be employed in the present embodiment without any particular restrictions.

In this method, the material of the mask base material may be either of a metallic material and a resin material, and a laser light source (specifically, the wavelength and pulse width of the laser light source) suitable for the material may be selected. For example, if the mask base material is a metallic material such as Ni or SUS, a YAG laser may be used, and in a case of polyimide, an excimer laser or the like may be used. In a case of forming particularly fine through-holes 20, it is preferable to prevent the hole shape from being deformed by thermal influence using laser having a pulse width less than or equal to a nanosecond.

In etching, the mask base material is coated with a resist, and after subjecting the resist to exposure development, chemical etching is performed. The plurality of through-holes 20 can thereby be formed in the mask base material. By controlling the photosensitivity in the resist film during exposure, the longitudinal sectional shape and transverse sectional shape of the through-holes 20 can be controlled. The specific method of etching is not particularly restricted, and a publicly-known method can be applied arbitrarily.

In additive plating, a stand material is coated with a resist, and the resist is subjected to exposure development. Thereafter, a plating material to be the mask base material is grown at positions where the resist has been removed, and the stand material and the resist are separated and removed chemically and physically. The through-holes 20 can thereby be formed in the mask base material. By controlling the photosensitivity in the resist film during exposure similarly to etching, the longitudinal sectional shape and transverse sectional shape of the through-holes 20 can be controlled. A specific method of additive plating is described in JP 2012-19236A, for example, and this method can be employed in the present embodiment without any particular restrictions.

Figure 3:
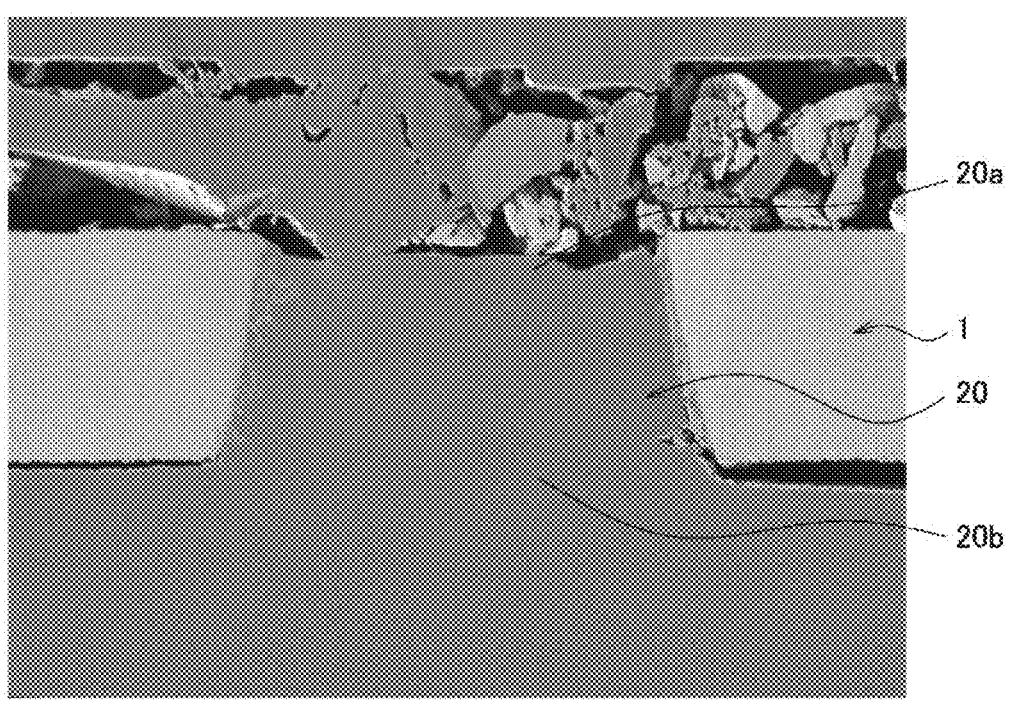
FIG. 3 is a longitudinal sectional SEM image showing an example of a through-hole shape.

FIG. 3 shows a longitudinal sectional SEM image of the microparticle arraying mask 1 actually produced. As shown by this image, the through-hole 20 has a fun-out sectional shape.

<3. Method of Arraying Microparticles>

Figure 5:
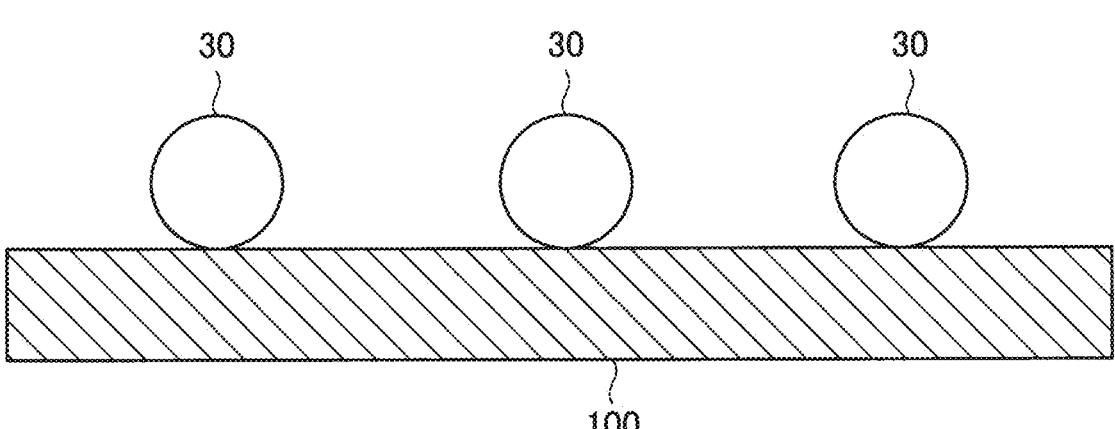
FIG. 5 is a longitudinal sectional view for describing the method of arraying microparticles through use of a microparticle arraying mask.

Next, a method of arraying the microparticles 30 through use of the microparticle arraying mask 1 will be described on the basis of FIG. 4 and FIG. 5.

First, the base material 100 is prepared. The surface of this base material 100 is a target surface on which the microparticles 30 will be arrayed in a post-process. A specific configuration of the base material 100 is not limited, and may be adjusted in accordance with properties or the like required of the base material 100. In a case of producing a particle-filled film, for example, the base material 100 is a film on which an adhesive layer has been formed on the surface, and in a case of producing a ball grid array substrate, the base material 100 is any type of substrate. A flux which is a provisional fixing film is formed by printing or the like at positions where the microparticles 30 are intended to be arrayed on the surface of the substrate. Note that the application of the particle-filled film in the present embodiment is not particularly restricted, and may be any application to which the particle-filled film according to the present embodiment is applicable. For example, the particle-filled film may be any type of conductive film, and can also be used as a film for Micro Electro Mechanical Systems (MEMS).

Then, the microparticle arraying mask 1 is arranged on the base material 100. Herein, the surface 1b on the microparticle discharge side is opposed to the base material 100. Then, many microparticles 30 are placed on the microparticle arraying mask 1. Herein, a specific configuration of the microparticles 30 is not limited, and varies in accordance with properties or the like required of the microparticles 30. In the case of producing a particle-filled film, for example, the microparticles 30 may be conductive particles or insulative particles (such as resin particles, for example). The properties of the microparticles 30 are determined in accordance with the application or the like of the particle-filled film. For example, in a case in which conductivity is required of the particle-filled film, the microparticles 30 are conductive particles. In the case of producing a ball grid array substrate, the microparticles 30 are solder balls. The diameter of the microparticles 30 is less than or equal to 50 μm as described above. The diameter of the microparticles 30 may be less than or equal to 20 μm. The lower limit value of the diameter of the microparticles 30 is not particularly restricted, and may be more than or equal to 3 μm, for example.

Then, as shown in FIG. 4, the microparticles 30 on the microparticle arraying mask 1 are scraped with the scraping instrument 200 such as a squeegee or doctor blade. Accordingly, some of the microparticles 30 are inserted into the through-holes 20, and the remaining microparticles (residual microparticles) 30 are discharged to the outside of the microparticle arraying mask 1. Herein, in a case of forming an adhesive layer on the surface of the base material 100, the adhesive layer is arranged under the microparticle arraying mask 1. Therefore, the microparticles 30 sink into the adhesive layer (=an elastic layer) during scraping, which can reduce damage to the microparticles 30. Therefore, defects in the microparticles 30 are less likely to occur. Thereafter, by removing the microparticle arraying mask 1, the microparticles 30 are arrayed on the base material 100 in a predetermined array pattern, as shown in FIG. 5. The array pattern of the microparticles 30 corresponds to the array pattern of the through-holes 20.

Herein, since the microparticle arraying mask 1 has the properties described above, defects in the microparticles 30 can be prevented when arraying the microparticles 30.

EXAMPLES

1. Example 1

(1-1. Preparation of Microparticle Arraying Mask)

A microparticle arraying mask was produced through the following steps. First, a SUS304 plate having a thickness of 15 μm was prepared as a mask base material. Then, many through-holes were formed in the mask base material by laser ablation. Herein, the through-holes had a hexagonal close packed array with a pitch of 60 μm. The through-holes had a circular transverse sectional shape. Furthermore, a fluorine-based coating material was applied to the microparticle arraying mask in order to increase demoldability of the microparticle arraying mask, and was dried. The diameter of the opening plane on the microparticle supply side after drying was 30 μm, and the diameter of the opening plane on the microparticle discharge side was 35 μm. The longitudinal sectional shape of the through-holes was a linear shape. That is, $dA/dz$ is a constant number greater than 0. The microparticle arraying mask was produced through the above steps. The properties of the microparticle arraying mask are shown in Table 1.

(1-2. Arraying of Microparticles Through Use of Microparticle Arraying Mask)

By forming an adhesive layer having a thickness of 20 μm on a PET film having a thickness of 100 μm, a base material was produced. Furthermore, conductive particles having a diameter of 20 μm obtained by plating a core made of an acrylic resin with gold were prepared as microparticles. Properties (diameters) of the microparticles are shown in Table 1.

Then, the microparticle arraying mask produced above was arranged on the base material (on the adhesive layer). Herein, a surface on the microparticle discharge side was opposed to the base material.

Then, many microparticles (conductive particles) were placed on the microparticle arraying mask, and these microparticles were scraped with a squeegee. Accordingly, some of the microparticles were inserted into the through-holes, and the remaining microparticles (residual microparticles) were discharged to the outside of the microparticle arraying mask. Thereafter, by removing the microparticle arraying mask, the microparticles were arrayed on the base material. That is, a particle-filled film obtained by arraying the conductive particles on the adhesive layer was produced.

Then, the particle-filled film was observed under the conditions of objective lenses 5× and 20× using the industrial microscope MX61 (available from Olympus Corporation) to observe the state of the arrayed microparticles. Specifically, it was observed whether the microparticles were respectively arranged one by one at 100 positions at which the through-holes were arranged. A case in which two or more microparticles were arranged at the same position was determined as an "overlapping" defect. That is, in Example 1 and each examples which will be described later, an array pattern obtained by inserting a single microparticle into a single through-hole was formed. A case in which a microparticle was absent was determined as a "falling out" defect, and a case in which there were cracks or breakage in the microparticles was determined as a "particle damage" defect. Then, an evaluation result of a defect of a type that is present at two or more positions among the 100 positions is expressed as "fail". The remaining cases were determined as "pass". The results are collectively shown in Table 1.

2. Examples 2 to 5 and Comparative Examples 1 to 5

Figure 6:
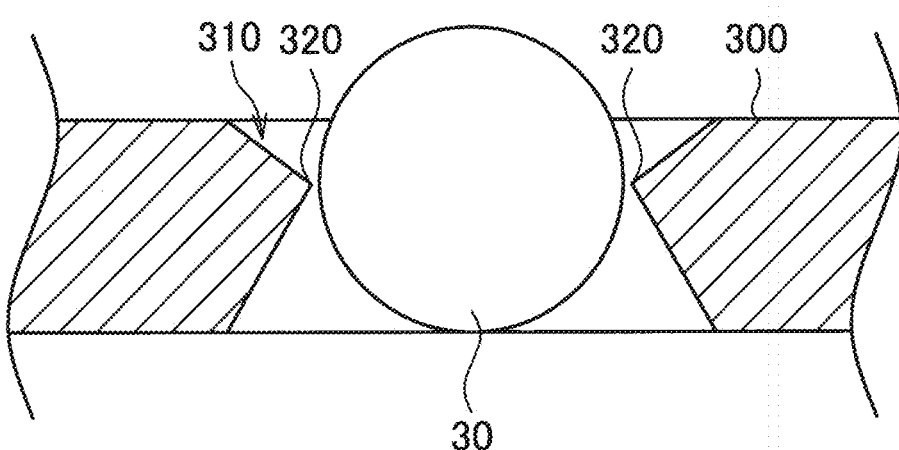
FIG. 6 is a longitudinal sectional view showing a schematic configuration of a microparticle arraying mask according to a comparative example.

In Examples 2 to 5 and Comparative examples 1 to 5, tests similar to that of Example 1 were conducted except that properties of microparticle arraying masks and microparticles were changed to those shown in Table 1. The results are collectively shown in Table 1. Note that in Comparative example 3, projections were formed on the inner wall surface of through-holes. A technology of forming projections in through-holes is disclosed in Patent Literature 1. FIG. 6 shows an example of projections. In a microparticle arraying mask 300 shown in FIG. 6, projections 320 are formed in a through-hole 310. In a case in which such projections are formed, dA/dz is less than 0 above the projections (on the microparticle supply side).

the "falling out" defect was "fail". Consequently, it has been revealed that in order to array microparticles on a base material while hardly causing defects in the microparticles, the requirements of the present embodiment need to be satisfied.

The preferred embodiment(s) of the present invention has/have been described above in detail with reference to the accompanying drawings, whilst the present invention is not limited to the above examples. A person skilled in the art may find various alterations and modifications within the scope of the appended claims, and it should be understood that they will naturally come under the technical scope of the present invention.

REFERENCE SIGNS LIST

1 microparticle arraying mask
20 through-hole
20a opening plane on the microparticle supply side
20b opening plane on the microparticle discharge side
30 microparticle
100 base material
The invention claimed is:
1. A microparticle arraying mask for arraying microparticles having a diameter of less than or equal to 50 μm on a base material, wherein

TABLE 1

| | | Diameter of opening on microparticle supply side (μm) | Diameter of opening on microparticle discharge side (μm) | Projections on inner wall surface of through-holes | Particle diameter d (μm) | Mask thickness t (μm) | t/d | Particle damage | Falling out | Overlapping |
|---|---|---|---|---|---|---|---|---|---|---|
| Example | 1 | 30 | 35 | n/a | 20 | 15 | 0.75 | pass | pass | pass |
| | 2 | 60 | 70 | n/a | 40 | 30 | 0.75 | pass | pass | pass |
| | 3 | 15 | 18 | n/a | 10 | 7.5 | 0.75 | pass | pass | pass |
| | 4 | 30 | 42 | n/a | 20 | 20 | 1 | pass | pass | pass |
| | 5 | 30 | 33 | n/a | 20 | 8 | 0.4 | pass | pass | pass |
| Comparative example | 1 | 35 | 35 | n/a | 20 | 15 | 0.75 | pass | pass | fail |
| | 2 | 30 | 30 | n/a | 20 | 15 | 0.75 | pass | fail | pass |
| | 3 | 30 | 35 | formed | 20 | 15 | 0.75 | fail | pass | pass |
| | 4 | 25 | 35 | n/a | 20 | 30 | 1.5 | pass | pass | fail |
| | 5 | 65 | 70 | n/a | 40 | 15 | 0.375 | fail | fail | pass |

3. Evaluations

Since Examples 1 to 5 satisfied the requirements of the present embodiment, defects in microparticles hardly occurred, and evaluation of every type of defects was "pass". On the other hand, Comparative examples 1 to 5 did not satisfy any of the requirements of the present embodiment, and therefore, evaluation of any type of defects was "fail". Specifically, in Comparative Examples 1 and 2, the diameter of the opening plane on the microparticle supply side and the diameter of the opening plane on the microparticle discharge side had the same value, and dA/dz=0 held in the whole region along the z-axis. That is, the through-holes had a straight shape. Therefore, evaluation of the "overlapping" defect or "falling out" was "fail". In Comparative example 3, since projections were formed, dA/dz was less than 0 above the projections. Therefore, evaluation of the "particle damage" defect was "fail". Note that in Comparative example 3, the projections might have damaged the microparticles 30. In Comparative Example 4, t/d exceeded 1.0. Therefore, evaluation of the "overlapping" defect was "fail". In Comparative Example 5, t/d was less than 0.4. Therefore, evaluation of the "particle damage" defect and the microparticle arraying mask has through-holes into which the microparticles are inserted,
an opening plane of the through-holes on a microparticle supply side has an area smaller than an area of an opening plane of the through-holes on a microparticle discharge side, and
in a case of assuming that a direction from the opening plane on the microparticle supply side to the opening plane on the microparticle discharge side is a positive direction of a z-axis, and a sectional area of the through-holes vertical to the z-axis is A,
dA(z)/dz>0 holds in a whole region in the through-holes along the z-axis, and
Expression (1) below is satisfied:

$$0.4 \le t/d < 0.7 \tag{1}$$

where, in Expression (1), t indicates a thickness of the microparticle arraying mask, and d indicates the diameter of the microparticles,
wherein the microparticle arraying mask has a thickness of less than or equal to 50 μm, and
a longitudinal sectional shape of the through-holes is an asymmetric shape about a central axis.

2. The microparticle arraying mask according to claim 1, wherein the opening plane of the through-holes on the microparticle supply side has a diameter of less than 100 μm.

3. The microparticle arraying mask according to claim 1, wherein the diameter of the microparticles is less than or equal to 20 μm.

4. An apparatus comprising a microparticle arraying mask for arraying microparticles on a base material, and the microparticles, wherein the microparticle arraying mask has through-holes into which the microparticles are inserted, an opening plane of the through-holes on a microparticle supply side has an area smaller than an area of an opening plane of the through-holes on a microparticle discharge side, and in a case of assuming that a direction from the opening plane on the microparticle supply side to the opening plane on the microparticle discharge side is a positive direction of a z-axis, and a sectional area of the through-holes vertical to the z-axis is A, dA(z)/dz>0 holds in a whole region in the through-holes along the z-axis, Expression (1) below is satisfied:

$$0.4 \leq t/d < 0.7 \tag{1}$$

where, in Expression (1), t indicates a thickness of the microparticle arraying mask, and d indicates the diameter of the microparticles, wherein the microparticle arraying mask has a thickness of less than or equal to 50 μm, wherein the microparticles have a diameter of less than or equal to 50 μm and are present in the through-holes, and a longitudinal sectional shape of the through-holes is an asymmetric shape about a central axis.

5. The apparatus according to claim 4, wherein the opening plane of the through-holes on the microparticle supply side has a diameter of less than 100 μm.

6. The apparatus according to claim 4, wherein the diameter of the microparticles is less than or equal to 20 μm.

* * * * *